United States Patent [19]

Mantei

[11] Patent Number: 5,196,670
[45] Date of Patent: Mar. 23, 1993

[54] MAGNETIC PLASMA PRODUCING DEVICE WITH ADJUSTABLE RESONANCE PLANE

[75] Inventor: Thomas D. Mantei, Cincinnati, Ohio

[73] Assignee: University of Cincinnati, Cincinnati, Ohio

[21] Appl. No.: 416,531

[22] Filed: Oct. 3, 1989

[51] Int. Cl.$^5$ .................................................. B23K 9/00
[52] U.S. Cl. ............................ 219/121.43; 219/121.4;
219/121.49; 156/345; 204/298.38
[58] Field of Search ........... 219/121.4, 121.41, 121.43,
219/121.49; 315/111.51, 111.21; 156/643, 646,
345; 204/298.37, 298.38, 298.17; 427/34

[56] References Cited

U.S. PATENT DOCUMENTS

| | | | |
|---|---|---|---|
| 4,433,228 | 2/1984 | Nishimatsu et al. | 219/10.55 R |
| 4,483,737 | 11/1984 | Mantei | 156/646 |
| 4,745,337 | 5/1988 | Pichot et al. | 315/111.71 |
| 4,761,219 | 8/1988 | Sasaki et al. | 204/298.37 |
| 4,786,361 | 11/1988 | Sekine et al. | 204/298.37 |
| 4,876,983 | 10/1989 | Fukuda et al. | 204/298.37 |
| 4,891,560 | 1/1990 | Okumura et al. | 204/298.37 |
| 4,915,979 | 4/1990 | Ishida et al. | 204/298.38 |
| 4,970,435 | 11/1990 | Tanaka et al. | 204/298.38 |

FOREIGN PATENT DOCUMENTS 0286132 2/1988 European Pat. Off. .
0284867 3/1988 European Pat. Off. .

Primary Examiner—Mark H. Paschall
Attorney, Agent, or Firm—Wood, Herron & Evans

[57] ABSTRACT

An apparatus is provided for the production of plasma. An evacuable chamber is operatively connected to a microwave waveguide, down which microwave energy at approximately 2.45 GHz is transported. The microwave energy enters the evacuable chamber through an opening in the upper wall of the chamber covered by microwave transparent material. Centrally located above the opening in the upper wall of the chamber and outside the waveguide, a permanent magnet is provided. The strong downward magnetic field of the magnet enters the chamber in the same direction as the propagation path of the microwaves. The downward magnetic field component is at a right angle to the electric field associated with the microwaves. A working gas is introduced to the chamber by a plurality of gas inlets operatively connected to the chamber. At some point within the vacuum of the chamber, the electrons rotating about the downward magnetic field component are in phase with the electric field of the microwaves. These electrons acquire sufficient energy at this point to dissociate molecules of the working gas into atoms and to remove electrons from atoms to form ions and free electrons. This plasma of ions, electrons and atoms is then used to perform work on a workpiece provided on a support with the chamber.

10 Claims, 1 Drawing Sheet

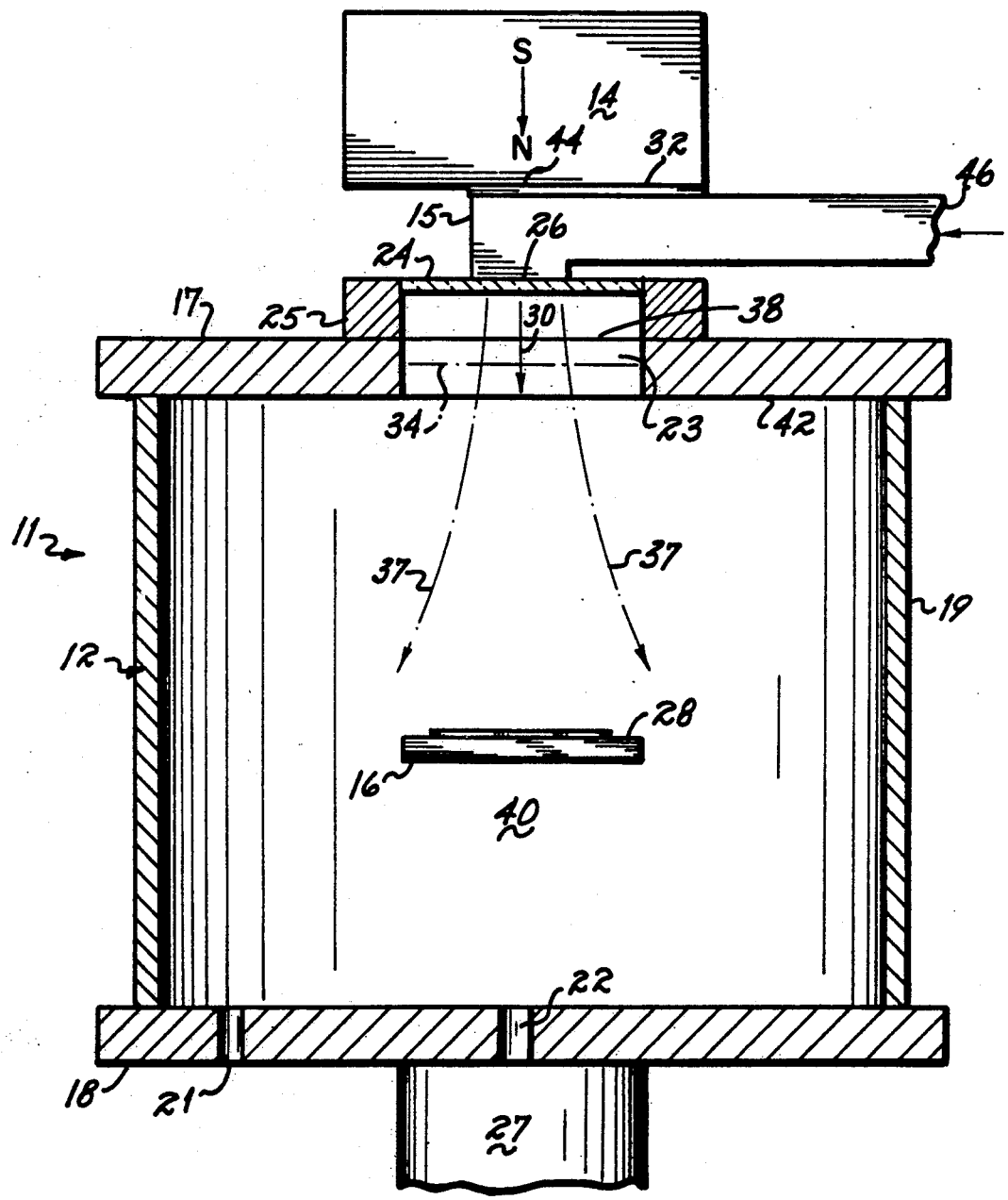

MAGNETIC PLASMA PRODUCING DEVICE WITH ADJUSTABLE RESONANCE PLANE

BACKGROUND OF THE INVENTION

Plasma devices are used to form ions, electrons, and dissociated neutral atoms from a gas. The dissociated ions and neutral atoms are then used to remove material from a work sample, grow material on a work sample or implant ions in a work sample. Two primary methods are used for producing the plasma. The first method uses electrodes which are arranged in the plasma chamber walls. These electrodes are electrically charged to produce ions and electrons from the gas within the plasma chamber. A device of this type is disclosed in EP 0284867A2.

The second primary method for producing plasma uses a magnetic field in conjunction with microwave energy. This method produces plasma from the working gas by the interaction of a magnetic field and an electric field. The electric field is associated with microwaves which enter the device chamber from a microwave waveguide. The electric field associated with the microwaves is perpendicular to the propagation path of the microwaves. If a magnetic field is provided at a right angle to the electric field, the electric field and the rotation of plasma electrons around the magnetic field will be in phase at some point. This point is referred to as the plane of resonance. At the plane of resonance the microwave electric field is constantly accelerating the electrons rotating about a magnetic field. This acceleration imparts sufficient energy to the electrons to dissociate molecules of the working gas into atoms and to remove electrons from the atoms to create ions and additional electrons. These ions and neutral atoms then travel in the direction of the magnetic field and impinge upon the work surface.

In this method of plasma production, magnetic fields are produced by one of two methods. The first method requires the use of electromagnets. These magnets are usually in the shape of a solenoid which encloses most or part of a plasma excitation chamber. The circulation of current through the magnets can produce excessive heat. The circuitry to control the strength of the magnetic fields generated by the energized coils and the considerable size and weight of such electromagnets increase the costs of these systems.

To eliminate the disadvantages of electromagnets, permanent magnets have been used. U.S. Pat. No. 4,433,228, for example, discloses a microwave plasma source which places a permanent magnet within a microwave waveguide. While electrical power consumption is reduced by replacing the electromagnet with a permanent magnet, this placement of the magnet results in the heating of the magnetic material by the microwaves. This heating reduces the effective life of such magnetic material. Additionally, the electric field associated with the microwaves is rotated once it passes through the magnetic material and the electric field strength is attenuated by the magnetic material. Adjusting the resonance plane for the production of the plasma is also difficult since the magnetic material is within the plasma chamber or the microwave waveguide.

Another plasma producing device which uses permanent magnets is disclosed in European Patent Application 0286132A2. This plasma producing device requires multiple magnets. These multiple magnets are necessary to produce a magnetic field which projects downwardly into the container. These multiple magnets are arranged in two layers of opposing polarity. The opposing polarities within proximity of one another produce magnetic flux lines within the container. These flux lines produce a downward component of a magnetic field within the container. This downward component then interacts with the electric field of the microwave energy to produce the plasma from the working gas.

The requirement of multiple permanent magnets increases the cost of these plasma producing devices. The use of multiple magnets also make adjustments in the placement of the plane of resonance more difficult since more than one magnet must be moved. Finally, the multiple magnet structure requires more magnetic material to produce a magnetic field of the same strength in the plane of resonance as would a more centrally located single magnet.

SUMMARY OF THE INVENTION

It is an object of the present invention to provide an apparatus for reducing the power consumption experienced in electromagnetic plasma producing devices and for producing stronger, more uniform magnetic fields than the multiple magnet arrangements in permanent magnet plasma producing devices.

It is also an object of the present invention to provide such an apparatus so that microwaves do not impinge upon or pass through the magnet.

It is further an object of this invention to provide a simple external adjustment for the position of the plane of resonance within the container.

In a preferred embodiment, the present invention includes a chamber for holding a workpiece, a waveguide which opens into the chamber and a permanent magnet placed directly above the chamber. The waveguide presents the microwaves at the opening of the waveguide with a propagation path substantially perpendicular to the chamber's upper surface with the magnet resting on the waveguide. In another preferred embodiment, an adjusting element is placed between the permanent magnet and the waveguide. This adjusting element can uniformly vary the spatial distance between the permanent magnet and the upper surface of the waveguide. By adjusting this distance, placement of the plane of resonance within the plasma excitation chamber can be varied.

These and other objects and advantages of the present invention shall be made apparent from the accompanying drawings and the description thereof wherein:

BRIEF DESCRIPTION OF THE DRAWING

The FIG. is a side view of the vertical cross section of the invention.

DESCRIPTION OF THE PREFERRED EMBODIMENT

The present invention as shown in the figure is a plasma generating device 11 which includes an evacuable chamber 12, a permanent magnet 14, a waveguide 15 for microwaves and a work support 16 located in the interior of chamber 12.

The evacuable chamber 12 is a cylindrical chamber having a top wall 17, a bottom wall 18 and a cylindrical side wall 19. Preferably, the chamber is made out of stainless steel, aluminum, or other nonferromagnetic material. The thickness should be effective to withstand evacuation to at least about $1 \times 10^{-6}$ Torr (0.10" for stainless steel). The bottom wall 18 includes at least one gas inlet opening 21. In addition, the bottom wall 18 includes a second opening 22 which is connected to a vacuum source (not shown) but preferably is a vacuum pump which is capable of reducing the pressure of chamber 12 to at least about $1 \times 10^{-6}$ Torr.

The top wall 17 of chamber 12 includes a central opening 23 which has a quartz window 24 mounted above the opening 23 supported by a flange 25. The flange and quartz window are sealed to permit the chamber to be evacuated. The chamber area bounded by the lower edge 42 of the top wall 17, the bottom wall 18 and the cylindrical side wall 19 is the working chamber 40. The area below the quartz window 24 and above the lower edge 42 is the plasma excitation chamber 38. The working chamber 40 is usually one-half to three feet in diameter.

Imbedded in the side walls of chamber 12 are permanent magnets (not shown). These magnets control the process within the working chamber and are not necessary for the present invention. This magnet arrangement is disclosed in U.S. Pat. No. 4,483,737, the disclosure of which is hereby incorporated by reference.

The work support 16 is disposed beneath the opening 23 in the top wall 17 of the chamber 12. Various work supports are well known and the specific work support forms no part of the present invention.

The window 24 previously noted is constructed of material transparent to microwave radiation, most typically, quartz or aluminum oxide. A first end 46 of the waveguide 15 is connected to a microwave power generation source (not shown), such as a magnetron source produced by Cober Electronics, Inc. The microwaves produced by the generating source travel down the waveguide and exit at the second end 26 adjacent to the quartz window 24. The microwaves pass through window and enter the plasma excitation chamber 38. The propagation path of these microwaves is approximately perpendicular to the surface 28 of support 16 and is represented by arrow 30. These microwaves typically have a frequency in the range of 2.45 GHz. The waveguide is typically constructed from brass or aluminum and for the microwave frequency previously mentioned has the dimension of $1\frac{1}{2}'' \times 3'' \times 9''$ or thereabouts.

The permanent magnet 14 is positioned above waveguide 15 resting on a shim 32 with its N-S poles roughly aligned with the direction of propagation of the microwaves as shown by arrow 30. This magnet is usually composed of a magnetic compound such as neodymium-boron-ferrite, such as that provided by Permag and denoted as Grade 30. A block of this material approximately $6'' \times 6'' \times 3.5''$ can produce a magnetic field of approximately 4,000 Gauss at the polar surface of the magnet. By positioning the center of the magnet pole 44 over the center of the opening 23 in the upper wall 17 of the chamber 12, a component of the magnetic field is directed in a predominantly downward direction through the center of the opening 23 toward the work sample 9 in the interior of the work chamber 40. This magnetic field component is in the direction of the microwave propagation and is at a right angle to the electric field associated with the microwaves.

In operation, plasma is produced within the chamber 12 by the interaction of the magnetic field from the permanent magnet 14 and the electric field of the microwaves in conjunction with the presence of an working gas. Specifically, a working gas such as $CF_4$, $SF_6$, $Cl_2$ or Ar or any combination thereof is admitted to the interior of the chamber 12 through a gas inlet 21 or a plurality of such inlets. The working gas is introduced into the chamber 12 after the chamber is purged with a dry gas or by a load lock, technique. The purging method and load lock technique are well known within the art. The microwave power generator then generates microwaves which travel down the microwave waveguide 15 to the waveguide opening 26 which rests atop the quartz Window 24. These microwaves enter the interior of the plasma excitation chamber 38 after passing through the quartz window 24. This electric field oscillates at a right angle to the propagation path of the microwaves (shown by arrow 30). The working pressure in chamber 12 is maintained at about $1 \times 10^{-3}$ Torr by the vacuum pump (not shown). Any effluent from the work performed in the work chamber 40 is collected by the vacuum pump operatively connected to the chamber 12.

The downward magnetic field component (shown by arrows 37) associated with the permanent magnet 14 extends predominantly downwardly into the interior of the plasma excitation chamber 38 and passes through the propagating microwaves. At a point between the window material 24 and the lower edge 42 of upper wall 17, the electric field and the electron rotation around the magnetic field will be in phase. This area where the rotation of the electrons about the magnetic field and the electric field are in phase is denoted as the plane of resonance 34 in the figure.

When the microwaves have a frequency of approximately 2.45 GHz the plane of resonance will occur at the point where the axial magnetic field component has a field strength of 875 Gauss. When the distance between the waveguide opening 26 and the center of the magnetic pole 44 is approximately $1\frac{1}{2}''$ the plane of resonance occurs near the lower edge 42. At this point, the microwave electric field continually accelerates electrons. This continual acceleration imparts sufficient energy to electrons to produce ions, electrons and dissociated neutral atoms from the working gases which are present at the plane of resonance 34. These ions, electrons, and dissociated neutral atoms then travel along the magnetic field direction indicated by arrows 37 towards the workpiece 36 on the support 16. These ions, electrons, and dissociated neutral atoms can then etch material from the work sample, implant ions or atoms beneath the surface of the work sample or grow material on the work sample.

Shim 32 acts to adjust the distance between the permanent magnet 14 and the waveguide 15. A number of shims can be placed beneath the permanent magnet 14 to increase the distance between the permanent magnet 14 and the waveguide 15. As the distance from the permanent magnet 14 to the interior of the plasma excitation chamber 38 is increased, the strength of the axial magnetic field component within the plasma excitation chamber 38 is decreased. This decrease in field strength causes the point where the magnetic field is approximately 875 Gauss to move closer to the waveguide opening 26. Thus, the plane of resonance will also move closer to the waveguide opening 26 since the plane occurs where the magnetic field at approximately 875 Gauss is in phase with the rotation of the electrons around the magnetic field. By moving the plane of resonance 34 in this manner the energies and densities of the plasma which reach the workpiece 36 can be varied.

The plane of resonance can also be varied by installing a waveguide with a height dimension greater than 1⅜". This also increases the distance between the permanent magnet 14 and the plasma excitation chamber 38. Once the shims or waveguide height exceed 2⅛" or thereabout the magnetic field strength is less than 875 Gauss throughout the plasma excitation chamber. Thus, for microwaves having a frequency of 2.45 GHz a plane of resonance can no longer be produced.

The dimensions of the microwave waveguide are inversely proportional to the frequency of the microwaves. As microwave frequency increases the dimensions of the microwave guide decreases. With the increase in microwave frequency a corresponding linear increase is also needed in the magnetic field to produce a plane of resonance. Thus, while the magnet 14 is moved closer to the plasma excitation chamber 38 by a decrease in the microwave guide 15 dimensions, the required field strength of the magnet 14 is increased and is limited by the realizable magnetic permeability of current materials. In the present invention, a waveguide height of 1⅜" to 2⅛" is preferred.

As can be appreciated from the discussion above, the present invention has several advantages over both types of plasma producing devices known in the prior art. For example, no electrical power is needed to generate magnetic fields nor is any external circuitry needed to control the strengths of these magnetic fields. Rather, the magnetic field is constantly provided by the permanent magnet and the only variation in field strength within the plasma excitation chamber occurs from the placement of shims underneath the permanent magnet or variations in the geometry of the waveguide.

The life of the permanent magnet is also extended since the magnet is not in the propagation path of the microwaves and therefore is not heated by the microwaves. Since the permanent magnet is centrally located over the opening in the microwave waveguide, which is diammetrically opposed to the workpiece, a strong downward magnetic component is produced in the center of the microwave propagation path. Denser plasma is made possible by the provision of this strong magnetic field component within the plasma excitation chamber due to the central placement of the permanent magnet. Finally, only one permanent magnet is necessary to provide this strong magnetic field component for the production of the plasma.

While the present invention has been illustrated by the description of the preferred embodiment and the embodiment has been described in considerable detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept which is defined by the appended claims.

What is claimed:

1. A plasma producing device comprising:
   a chamber having at least one opening;
   means for transporting microwave energy and an associated electric field with said microwave energy along a path through said opening into said chamber; and
   a permanent magnet having a north and a south pole outside said transporting means, said north and south pole of said permanent magnet being aligned with said path of said microwave energy through said opening so that a predominant axial magnetic field component produced by said permanent magnet extends through said means for transporting microwave energy and through said opening into said chamber, whereby electrons within said chamber rotating around said magnetic field component and said electric field associated with said microwave energy are in phase within a plane within said chamber.

2. The plasma producing device claimed in claim 1 wherein said permanent magnet is supported by said means for transporting microwave energy.

3. A plasma producing device according to claim 2, the device further comprising:
   adjusting means interposed between the permanent magnet and the means for transporting microwave energy.

4. A plasma producing device according to claim 1, the device further comprising:
   a gas inlet and a vacuum means operatively connected to the chamber.

5. A plasma producing device, the device comprising:
   an evacuable chamber having an opening;
   a microwave guide connected to said chamber at said opening so that microwaves having an associated electric field are transported through said microwave guide and said opening into said chamber; and
   a permanent magnet above said microwave guide, said permanent magnet having north and south poles that are axially aligned with said microwave guide and said opening in said chamber so that a predominant axial magnetic field component produced by said permanent magnet is perpendicular to the electric field associated with said microwaves and enters said chamber through said microwave guide and said opening to generate a resonance plane within said chamber.

6. A plasma producing device according to claim 5, the device further comprising:
   adjusting means interposed between the permanent magnet and the microwave guide.

7. A plasma producing means according to claim 6, wherein the permanent magnet produces a magnetic field which is approximately 4,000 Gauss and said microwave guide is connected to a microwave source adapted to produce microwaves at about 2.45 GHz.

8. A microwave plasma generator with adjustable resonance plane comprising:
   a chamber having at least one opening;
   means for transporting microwaves through said opening into said chamber; and
   a permanent magnet having a north and south pole, one of said poles being interposed between the other said pole and said transporting means so that a predominant, axial magnetic component aligned with said poles of said magnet, said transporting means, and said opening and perpendicular to said electric field associated with said microwaves enters said chamber through said opening whereby said electric field and electrons rotating about said magnetic field are in phase at a plane within said chamber.

9. A magnetic plasma generator according to claim 8 wherein said magnetic field component travels through a portion of said transporting means and is centrally disposed within said transporting means.

10. A plasma producing device according to claim 8 further comprising:
    means for adjusting a distance between said permanent magnet and said transporting means so that said plane within said chamber where said magnetic field and said electric field are in phase can be varied.

* * * * *